(12) United States Patent
MacGregor et al.

(10) Patent No.: US 8,748,731 B2
(45) Date of Patent: Jun. 10, 2014

(54) CONCENTRATING SOLAR POWER WITH GLASSHOUSES

(75) Inventors: Roderick MacGregor, Livermore, CA (US); Peter Emery von Behrens, San Francisco, CA (US)

(73) Assignee: GlassPoint Solar, Inc., Fremont, CA (US)

( * ) Notice: Subject to any disclaimer, the term of this patent is extended or adjusted under 35 U.S.C. 154(b) by 212 days.

(21) Appl. No.: 13/146,910

(22) PCT Filed: Feb. 1, 2010

(86) PCT No.: PCT/US2010/022780
§ 371 (c)(1),
(2), (4) Date: Mar. 10, 2012

(87) PCT Pub. No.: WO2010/088632
PCT Pub. Date: Aug. 5, 2010

(65) Prior Publication Data
US 2012/0152307 A1   Jun. 21, 2012

Related U.S. Application Data

(60) Provisional application No. 61/149,292, filed on Feb. 2, 2009, provisional application No. 61/176,041, filed on May 6, 2009.

(51) Int. Cl.
*H01L 31/052*   (2006.01)

(52) U.S. Cl.
USPC ........... 136/246; 136/259; 126/604; 126/704; 126/600; 126/634; 60/641.15

(58) Field of Classification Search
USPC .......... 136/246, 259; 126/604, 704, 600, 634; 60/641.15
See application file for complete search history.

(56) References Cited

U.S. PATENT DOCUMENTS 1,240,890 A   9/1917   Shuman et al.
2,217,593 A   10/1940  London
(Continued)

FOREIGN PATENT DOCUMENTS

CN   2926930 Y    7/2007
CN   201359397 Y  12/2009

OTHER PUBLICATIONS

Search Report issued for Chinese Patent Application No. 201080006211.6 issued Feb. 17, 2013.
(Continued)

*Primary Examiner* — Golam Mowla
(74) *Attorney, Agent, or Firm* — Perkins Coie LLP

(57) ABSTRACT

A protective transparent enclosure (such as a glasshouse or a greenhouse) encloses a concentrated solar power system (e.g. a thermal and/or a photovoltaic system). The concentrated solar power system includes one or more solar concentrators and one or more solar receivers. Thermal power is provided to an industrial process, electrical power is provided to an electrical distribution grid, or both. In some embodiments, the solar concentrators are dish-shaped mirrors that are mechanically coupled to a joint that enables rotation at a fixed distance about respective solar collectors that are fixed in position with respect to the protective transparent enclosure. In some embodiments, the solar collectors are suspended from structure of the protective transparent enclosure and the solar concentrators are suspended from the solar collectors. In some embodiments, the greenhouse is a Dutch Venlo style greenhouse.

22 Claims, 4 Drawing Sheets

(56) References Cited

U.S. PATENT DOCUMENTS

| | | | |
|---|---|---|---|
| 2,221,919 A | 11/1940 | Kenan | |
| 4,015,585 A | 4/1977 | Fattor | |
| 4,095,369 A | 6/1978 | Posnansky et al. | |
| 4,149,523 A | 4/1979 | Boy-Marcotte et al. | |
| 4,174,752 A | 11/1979 | Slater et al. | |
| 4,184,482 A | 1/1980 | Cohen | |
| 4,249,340 A * | 2/1981 | Maes, Jr. | 47/17 |
| 4,282,394 A | 8/1981 | Lackey et al. | |
| 4,290,419 A | 9/1981 | Rabedeaux | |
| 4,318,394 A | 3/1982 | Alexander | |
| 4,386,600 A | 6/1983 | Eggert, Jr. | |
| 4,410,156 A | 10/1983 | Pischzik | |
| 4,462,390 A | 7/1984 | Holdridge et al. | |
| 4,628,142 A | 12/1986 | Hashizume | |
| 4,741,161 A | 5/1988 | Belart et al. | |
| 5,191,876 A | 3/1993 | Atchley | |
| 5,347,402 A | 9/1994 | Arbogast | |
| 5,524,610 A | 6/1996 | Clark | |
| 5,851,309 A | 12/1998 | Kousa | |
| 6,017,002 A | 1/2000 | Burke et al. | |
| 6,363,928 B1 | 4/2002 | Anderson, Jr. | |
| 6,485,152 B2 | 11/2002 | Wood | |
| 7,748,137 B2 | 7/2010 | Wang | |
| 7,858,875 B2 | 12/2010 | Lu | |
| 8,397,434 B2 * | 3/2013 | Bayne | 52/2.11 |
| 2003/0188477 A1 | 10/2003 | Pasternak | |
| 2004/0004303 A1 | 1/2004 | Iskra | |
| 2008/0083405 A1 | 4/2008 | Kimura et al. | |
| 2008/0163864 A1 | 7/2008 | Larson | |
| 2008/0216822 A1 | 9/2008 | Lazzara et al. | |
| 2009/0056704 A1 | 3/2009 | Donati et al. | |
| 2011/0203574 A1 | 8/2011 | Harding | |
| 2011/0240006 A1 | 10/2011 | Linke et al. | |
| 2012/0067337 A1 | 3/2012 | Hall et al. | |
| 2012/0167873 A1 | 7/2012 | Venetos et al. | |
| 2012/0234311 A1 | 9/2012 | Johnson et al. | |

OTHER PUBLICATIONS

Lim, Hyung Gun, PCT/US2010/022780 PCT International Search Report, Oct. 13, 2010, entire document, Korean Intellectual Property Office, Seo-gu, Republic of Korea.

Lim, Hyung Gun, PCT/US2010/022780 PCT Written Opinion, Oct. 13, 2010, entire document, Korean Intellectual Property Office, Seo-gu, Republic of Korea.

Linder, Nora, PCT/US2010/022780 PCT International Preliminary Report on Patentability, Aug. 2, 2011, entire document, International Bureau of WIPO, Geneva, Switzerland.

BrightSource Limitless, "Coalinga Project Facts, A BrightSource Energy Concentrating Solar Power Project," Fact Sheet, accessed Sep. 19, 2013, http://www.brightsourceenergy.com/stuff/contentmgr/files/0/ad5d33a2bc493a5079b5dda609724238/folder/coalinga_fact_sheet.pdf, 2 pages.

BrightSource Limitless, "Enhanced Oil Recovery Project—Coalinga," accessed Sep. 19, 2013, http://www.brightsourceenergy.com/coalinga, 2 pages.

Proz, 'on the edge of manufacturing tolerance'[bulletin board], Mar. 12, 2005 [retrieved on Jan. 7, 2014]. Retrieved from the internet <http://www.proz.com/kudoz/English/military_defense/968330-on_the_edge_of_manufacturing_tolerance.html>.

* cited by examiner

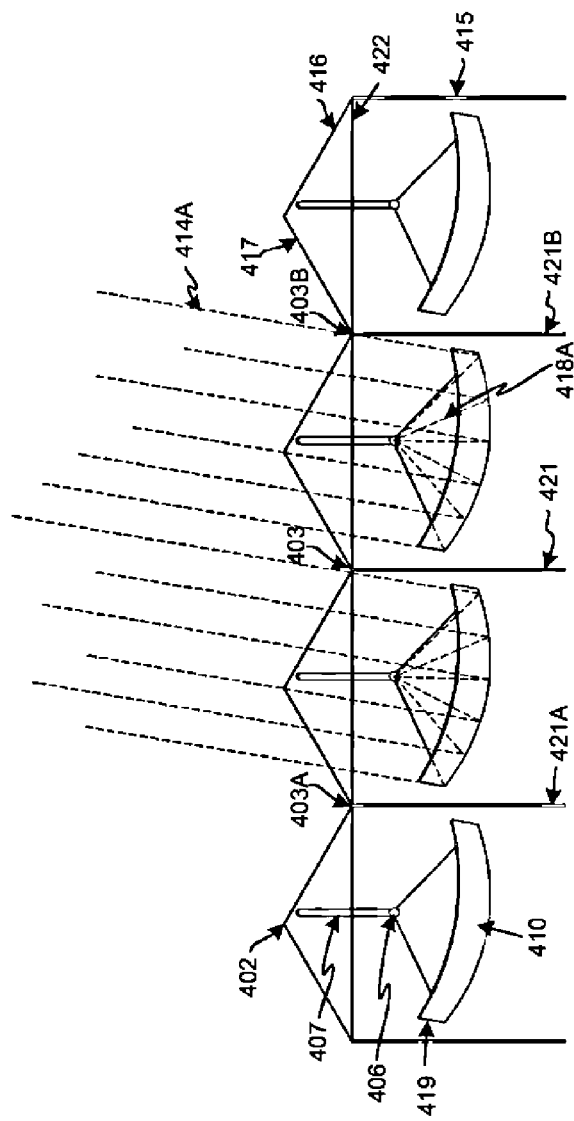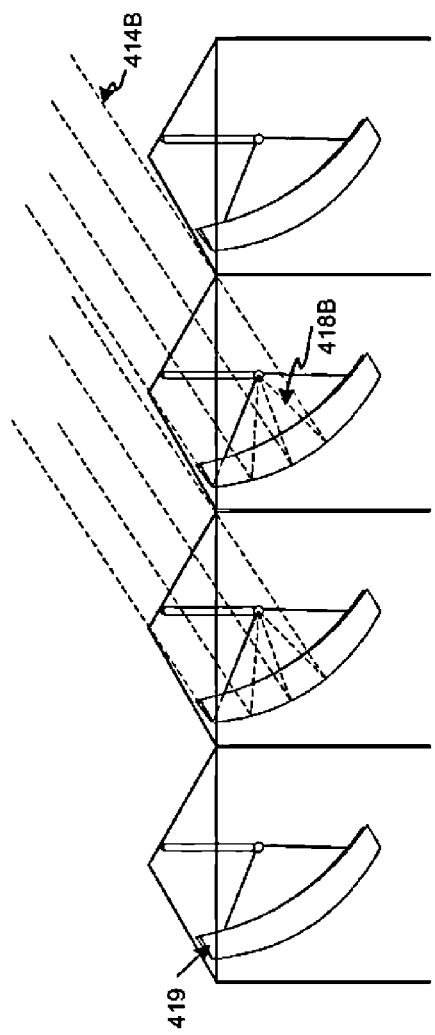
Fig. 4A
Fig. 4B

CONCENTRATING SOLAR POWER WITH GLASSHOUSES

CROSS REFERENCE TO RELATED APPLICATIONS

Priority benefit claims for this application are made in the accompanying Application Data Sheet, Request, or Transmittal (as appropriate, if any). To the extent permitted by the type of the instant application, this application incorporates by reference for all purposes the following applications, all owned by the owner of the instant application:

U.S. Provisional Application Ser. No. 61/149,292, filed Feb. 2, 2009, first named inventor Rod MacGregor, and entitled Concentrating Solar Power with Glasshouses; and U.S. Provisional Application Ser. No. 61/176,041, filed May 6, 2009, first named inventor Peter Von Behrens, and entitled Concentrating PhotoVoltaics with Glasshouses.

BACKGROUND

1. Field

Advancements in concentrated solar thermal power (CST), photovoltaic solar energy (PV), concentrated photovoltaic solar energy (CPV), and industrial use of concentrated solar thermal energy are needed to provide improvements in performance, efficiency, and utility of use.

2. Related Art

Unless expressly identified as being publicly or well known, mention herein of techniques and concepts, including for context, definitions, or comparison purposes, should not be construed as an admission that such techniques and concepts are previously publicly known or otherwise part of the prior art. All references cited herein (if any), including patents, patent applications, and publications, are hereby incorporated by reference in their entireties, whether specifically incorporated or not, for all purposes.

Concentrated solar power systems use mirrors, known as concentrators, to gather solar energy over a large space and aim and focus the energy at receivers that convert incoming solar energy to another form, such as heat or electricity. There are several advantages, in some usage scenarios, to concentrated systems over simpler systems that directly use incident solar energy. One advantage is that more concentrated solar energy is more efficiently transformed to heat or electricity than less concentrated solar energy. Thermal and photovoltaic solar receivers operate more efficiently at higher incident solar energy levels. Another advantage is that non-concentrated solar energy receivers are, in some usage scenarios, more expensive than mirror systems used to concentrate sunlight. Thus, by building a system with mirrors, total cost of gathering sunlight over a given area and converting the gathered sunlight to useful energy is reduced.

Concentrated solar energy collection systems, in some contexts, are divided into four types based on whether the solar energy is concentrated into a line-focus receiver or a point-focus receiver and whether the concentrators are single monolithic reflectors or multiple reflectors arranged as a Fresnel reflector to approximate a monolithic reflector.

A line-focus receiver is a receiver with a target that is a relatively long straight line, like a pipe. A line-focus concentrator is a reflector that receives sunlight over a two dimensional space and concentrates the sunlight into a significantly smaller focal point in one dimension (width) while reflecting the sunlight without concentration in the other dimension (length) thus creating a focal line. A line-focus concentrator with a line-focus receiver at its focal line is a basic trough system. The concentrator is optionally rotated in one dimension around its focal line to track daily movement of the sun to improve total energy capture and conversion.

A point-focus receiver is a receiver target that is essentially a point, but in various approaches is a panel, window, spot, ball, or other target shape, generally more equal in width and length than a line-focus receiver. A point-focus concentrator is a reflector (made up of a single smooth reflective surface, multiple fixed facets, or multiple movable Fresnel facets) that receives sunlight over a two-dimensional space and concentrates the sunlight into a significantly smaller focal point in two dimensions (width and length). A monolithic point-focus concentrator with a point-focus receiver at its focal point is a basic dish concentrated solar system. The monolithic concentrator is optionally rotated in two dimensions to rotate its focal axis around its focal point to track daily and seasonal movement of the sun to improve total energy capture and conversion.

A parabolic trough system is a line concentrating system using a monolithic reflector shaped like a large half pipe. The reflector has a 1-dimensional curvature to focus sunlight onto a line-focus receiver or approximates such curvature through multiple facets fixed relative to each other.

A concentrating Fresnel reflector is a line concentrating system similar to the parabolic trough replacing the trough with a series of mirrors, each the length of a receiver, that are flat or alternatively slightly curved in their width. Each mirror is individually rotated about its long axis to aim incident sunlight onto the line-focus receiver.

A parabolic dish system is a point concentrating system using a monolithic reflector shaped like a bowl. The reflector has a 2-dimensional curvature to focus sunlight onto a point-focus receiver or approximates such curvature through multiple flat or alternatively curved facets fixed relative to each other.

A solar power tower is a point concentrating system similar to the parabolic dish, replacing the dish with a 2-dimensional array of mirrors that are flat or alternatively curved. Each mirror (heliostat) is individually rotated in two dimensions to aim incident sunlight onto a point-focus receiver. The individual mirrors and an associated control system comprise a point-focus concentrator whose focal axis rotates around its focal point.

In solar thermal systems, the receiver is a light to heat transducer. The receiver absorbs solar energy, transforming it to heat and transmitting the heat to a thermal transport medium such as water, steam, oil, or molten salt. The receiver converts solar energy to heat and minimizes and/or reduces heat loss due to thermal radiation. In concentrated photovoltaic systems, the receiver is a photovoltaic surface that directly generates electricity from sunlight. In some solar thermal systems, CPV and CST are combined in a single system where a thermal energy system generates thermal energy and acts as a heat sink for photovoltaic cells that operate more efficiently when cooled. Other receivers, such as a stirling engine, that use solar energy to generate heat and then locally convert the heat to electricity through mechanical motion and an electric generator, are also deployed as a receiver, in some approaches.

In some concentrated solar systems, such as some systems with high concentration ratios, overall system is cost dominated by various elements such as the concentration system (such as a mirror or lens), a support system for the concentrators, and motors and mechanisms that enable tracking movement of the sun. The elements dominate the costs because the elements are enabled to withstand wind and weather. In some usage scenarios, solar energy systems are enabled to withstand various environmental dangers such as wind, rain, snow, ice, hail, dew, rodents, birds and other animals, dust, sand, moss, and other living organisms. Reflectivity of a concentrator is sensitive to damage, tarnishing, and dirt buildup since only directly reflected sunlight, not scattered sunlight, is effectively focused.

Glass mirrors are used in some concentrated systems, because of an ability to maintain good optical properties over long design lives (e.g. 30 years) of concentrated solar systems. Glass is relatively fragile and vulnerable to hail and other forms of damage unless it is suitably thick, e.g. 4-5 mm for relatively larger minors. In a 400 square foot concentrating dish the thickness results in a weight of close to 1000 lbs or about nine kg per meter of concentrator area. The mirror is formed in a precise curve, in one dimension for a trough, in two dimensions for a dish, to focus sunlight.

In some concentrated systems, minor surfaces cease to focus as intended if warped. Thus, the reflector is supported and held in shape by a metal superstructure that is shaped to the curved glass. The superstructure supports and protects the minor from environmental conditions such as winds of 75 mph or more. The winds add an additional 10,000 lbs of load beyond the 1000 lb weight of the mirror, resulting in complex construction requiring roughly 20 kg of structural steel for every meter of minor area in a dish system.

In some concentrated systems, concentrator tracking motors move the 30 kg per square meter weight of the concentrator, and also overcome force of wind that exceeds an additional 300 kg per sq meter. The motors are exposed to environmental elements (such as, dirt, dust, moisture, etc).

In some CST systems, parabolic dishes with point-focus receivers are not used, at least in part because structural demands on the dish are prohibitive and designing a tracking mechanism that keeps the focal point fixed (to avoid complex and expensive mechanisms to connect the thermal medium system) is impractical.

Synopsis

The invention may be implemented in numerous ways, including as a process, an article of manufacture, an apparatus, a system, and a composition of matter. In this specification, these implementations, or any other form that the invention may take, may be referred to as techniques. The Detailed Description provides an exposition of one or more embodiments of the invention that enable improvements in performance, efficiency, and utility of use in the field identified above. The Detailed Description includes an Introduction to facilitate the more rapid understanding of the remainder of the Detailed Description. As is discussed in more detail in the Conclusions, the invention encompasses all possible modifications and variations within the scope of the issued claims.

BRIEF DESCRIPTION OF DRAWINGS

FIGS. 4A and 4B illustrate selected details of an embodiment of a greenhouse enclosure with enclosed solar concentrators and solar receivers in respective incident sunlight contexts, high angle (summer) and low angle (winter).

DETAILED DESCRIPTION

Figure 1:
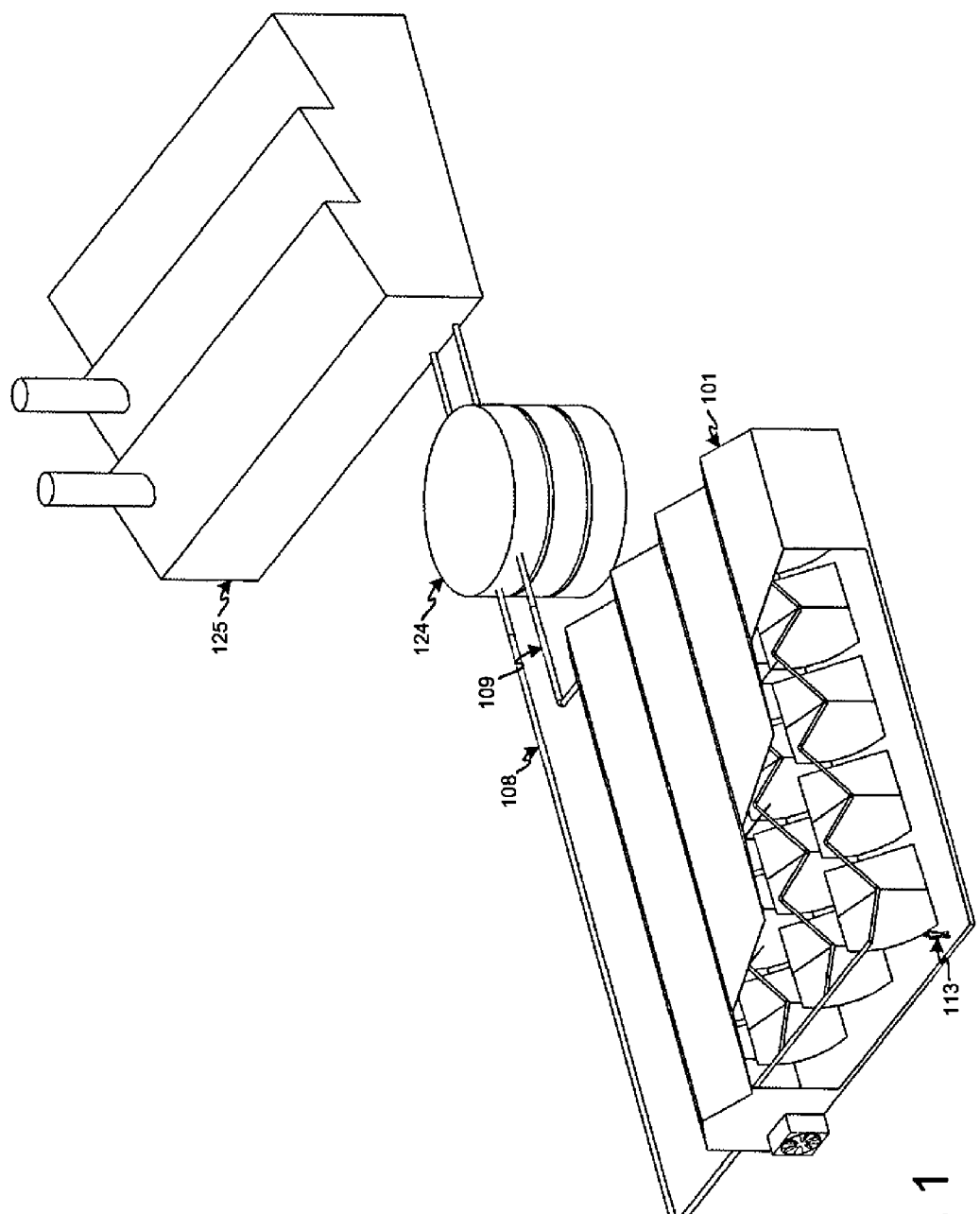
FIG. 1 illustrates an overview of an embodiment of a greenhouse-enclosed concentrated solar thermal system providing heat to a factory housing an industrial process.

A detailed description of one or more embodiments of the invention is provided below along with accompanying figures illustrating selected details of the invention. The invention is described in connection with the embodiments. The embodiments herein are understood to be merely exemplary, the invention is expressly not limited to or by any or all of the embodiments herein, and the invention encompasses numerous alternatives, modifications, and equivalents. To avoid monotony in the exposition, a variety of word labels (including but not limited to: first, last, certain, various, further, other, particular, select, some, and notable) may be applied to separate sets of embodiments; as used herein such labels are expressly not meant to convey quality, or any form of preference or prejudice, but merely to conveniently distinguish among the separate sets. The order of some operations of disclosed processes is alterable within the scope of the invention. Wherever multiple embodiments serve to describe variations in process, method, and/or features, other embodiments are contemplated that in accordance with a predetermined or a dynamically determined criterion perform static and/or dynamic selection of one of a plurality of modes of operation corresponding respectively to a plurality of the multiple embodiments. Numerous specific details are set forth in the following description to provide a thorough understanding of the invention. The details are provided for the purpose of example and the invention may be practiced according to the claims without some or all of the details. For the purpose of clarity, technical material that is known in the technical fields related to the invention has not been described in detail so that the invention is not unnecessarily obscured.

Introduction

This introduction is included only to facilitate the more rapid understanding of the Detailed Description; the invention is not limited to the concepts presented in the introduction (including explicit examples, if any), as the paragraphs of any introduction are necessarily an abridged view of the entire subject and are not meant to be an exhaustive or restrictive description. For example, the introduction that follows provides overview information limited by space and organization to only certain embodiments. There are many other embodiments, including those to which claims will ultimately be drawn, discussed throughout the balance of the specification.

In some circumstances, techniques described herein enable cost reduction of concentrated solar power systems. In various embodiments, collection (concentration and conversion of solar energy) is separated from protection. A protective transparent exoskeleton (such as a glasshouse or a greenhouse) surrounds and/or encloses collecting elements (or alternatively the collecting elements are placed in the exoskeleton), enabling the collecting elements (mirrors, lenses, etc) to be less robust than otherwise required. By separating collecting and protecting functions, and leveraging off-the-shelf technology (e.g. highly engineered, cost effective, and proven greenhouse technology, such as glass growers greenhouse technology) for the protection function, in some circumstances a reduction in cost and complexity of a system (such as mirrors/lenses, support structure, foundations, tracking mechanisms, etc.) is enabled with a relatively minimal impact on overall performance. The glasshouse is relatively low to the ground with little wind force bearing surfaces, and is designed to withstand wind and weather with a relatively minimal structural skeleton. Because the glasshouse reduces wind forces acting on the collector and receiver elements, the mirrors or lenses used for collection and concentration inside the exoskelital protection of the glasshouse are enabled to be lightweight, in some embodiments to a point of seeming flimsy, and thus are relatively less costly to construct, transport, support and aim, and have little or no weatherization costs. Note that within this disclosure, the terms glasshouse and greenhouse are used interchangeably, and are not meant to necessarily imply any sort of horticultural activity.

Protected embodiment techniques described herein are applicable to various concentrated solar power systems (e.g. a line-focus receiver with a single monolithic reflector, a line-focus receiver with multiple reflectors arranged as a Fresnel reflector, a point-focus receiver with a single monolithic reflector, or a point-focus receiver with multiple reflectors arranged as a Fresnel reflector, and more generally any of the approaches described in the background section) on an industrial scale. The protected embodiment techniques enable reflectors built from lighter materials with simpler and lighter frames since wind, weather, and UV light are reduced inside a glasshouse enclosure. Foundation, suspension, and tracking mechanisms for receivers and concentrators are enabled to be simpler, lighter, and less expensive.

Some embodiments of a concentrated solar system inside a glasshouse have an array of relatively large 3-D-freedomed, 2-D-solar-tracking parabolic dishes suspended from fixed roof locations, reminiscent of inverted inside-mirrored umbrellas focusing tracked sunlight onto receivers at the "handles" that are fixed relative to each umbrella bowl. Some embodiments have an array of O-D-solar-tracking (fixed position) concentrators. Some embodiments have an array of 1-D-solar-tracking, fixed line-focusing, parabolic troughs. Some embodiments have an array of fixed target point-focus power towers each with an associated array of suspended or floor mounted reflectors that together with an associated control system, embody a point-focus solar concentrator.

A glasshouse, such as a commercial greenhouse, efficiently supports flat glass planes. Supporting framework of straight metal sections brace each other and attach to the ground in multiple places. Some glasshouses designed to withstand the same weather conditions as an external parabolic dish require less than half as much structural steel (less than 10 kg) per square meter of concentrator, compared to an external parabolic dish. Total weight, including 4-5 mm glass, is less than 20 kg per square meter of concentrator, for the glasshouse.

According to various embodiments, concentrators are made entirely or partially of thin-gauge aluminum foil, reflective film, or other relatively reflective and lightweight materials. Some of the materials have higher reflectivity than glass mirrors. Concentrators, in some embodiments, are foam core combined with reflective material, enabling concentrators weighing less than one kg per square meter. Lightweight construction, in some usage scenarios, reduces one or more of costs associated with production, transportation, and installation of concentrators. Total weight for some enclosed concentrated solar energy embodiments (including exoskeleton and protected collector) is less than 20 kg per square meter of concentrator.

The glasshouse structure is primarily fixed and immobile, and tracking systems control and aim the less than one kg per square meter concentrators inside the structure in an environment having relatively small wind forces.

In some embodiments, a commercial greenhouse is a suitable enclosure as taught by the techniques described herein. Growers have determined that for many types of plants, 1% less light reaching plants equals 1% less crop growth and hence profit. Greenhouse designs are optimized to reduce cost, structural shading, glass reflective losses, and glass transmission losses. In some usage scenarios, the structural shading, glass reflective losses, and glass transmission losses cause a majority of lost sunlight. The Dutch Venlo design is relatively efficient at reducing the losses. Options available in commercial greenhouses include low-shading structural design, anti-reflective glass coatings (to reduce reflective losses), and low-iron glass (to reduce transmissive losses).

In some embodiments, sunlight losses due to a glasshouse enclosure are less than 20% at 33 degrees latitude without an anti-reflective coated glass. In some embodiments using anti-reflective coated glass, losses are 13%. In some embodiments, techniques described herein improve salvage value of a system in one or more of obsolescence, abandonment, and destruction and/or damage due to storm, ice, corrosion, and earthquake events.

A commercial greenhouse has multiple uses and has, in some embodiments and/or usage scenarios, a ready sale market for a greenhouse sold in place or for relocation. In some embodiments, a greenhouse enclosure of a concentrated solar energy system is a significant portion of the system cost. Resale value of the greenhouse, in some usage scenarios, lowers overall risk of a solar energy project and/or reduces financing costs.

In some embodiments, point concentrating systems are advantaged over other systems by providing high concentration ratios for a given level of focusing effort due to focusing in two dimensions. In some embodiments, fixed receivers are advantaged over other systems to avoid complex and expensive mechanisms such as moving fluid joints or hoses to connect the thermal medium system. In some embodiments and/or usage scenarios, selected components (such as receivers or pipes) that are fixed during a tracking mode of operation are permitted to move or are moved due to expansion and contraction of materials or for cleaning during a maintenance mode of operation. In some embodiments, parabolic dish systems are advantaged over heliostats due to simplicity of moving and aiming a monolithic concentrator.

Thermal conduction and convection increase with wind speed, thus reducing efficiency of solar thermal receivers. In some non-enclosed concentrated system approaches, solar energy receivers are protected from environmental effects including heat loss and physical damage by an at least partially transparent protective enclosure for each receiver. In some enclosed embodiments, thermal energy receivers are enabled to minimize heat loss without using an enclosure for each receiver.

Concentrated Solar Energy System Usage Scenario

FIG. 1 illustrates an overview of an embodiment of a greenhouse-enclosed concentrated solar thermal system providing heat to a factory housing an industrial process. A concentrated solar energy system is enclosed within greenhouse 101 and providing thermal energy to industrial process 125 (such as housed in a factory). A concentrated solar energy system is connected through inlet pipe 108 and outlet pipe 109 to optional storage system 124. The outlet pipe carries a thermal medium that has been heated by the concentrated solar energy system to the storage system and thence on to industrial process 125. The inlet pipe carries cooler thermal medium back to the concentrated solar energy system for heating. In embodiments lacking an optional storage system, the outlet and inlet pipes are connected directly to the industrial process. Any portions of the pipes, both inside and outside the enclosure, are optionally thermally insulated to reduce heat loss.

Various industrial processes consume significant amounts of heat at temperatures generated by some embodiments of a concentrated solar energy system described herein. The industrial processes include electricity generation, seawater desalination, and drywall manufacturing. Storage system 124 is optionally included in the system and includes a reservoir for heated thermal medium and optionally includes a reservoir for cooler thermal medium waiting to return to the concentrated solar energy system for heating. Storing pre-heated thermal medium in the storage unit enables continuation of industrial processes between sunset and sunrise, and through overcast weather. Stick figure person 113 illustrates a scale of the system (with respect to greenhouse height as well as concentrator size and spacing) in some embodiments.

Concentrated Solar Energy System

Figure 2:
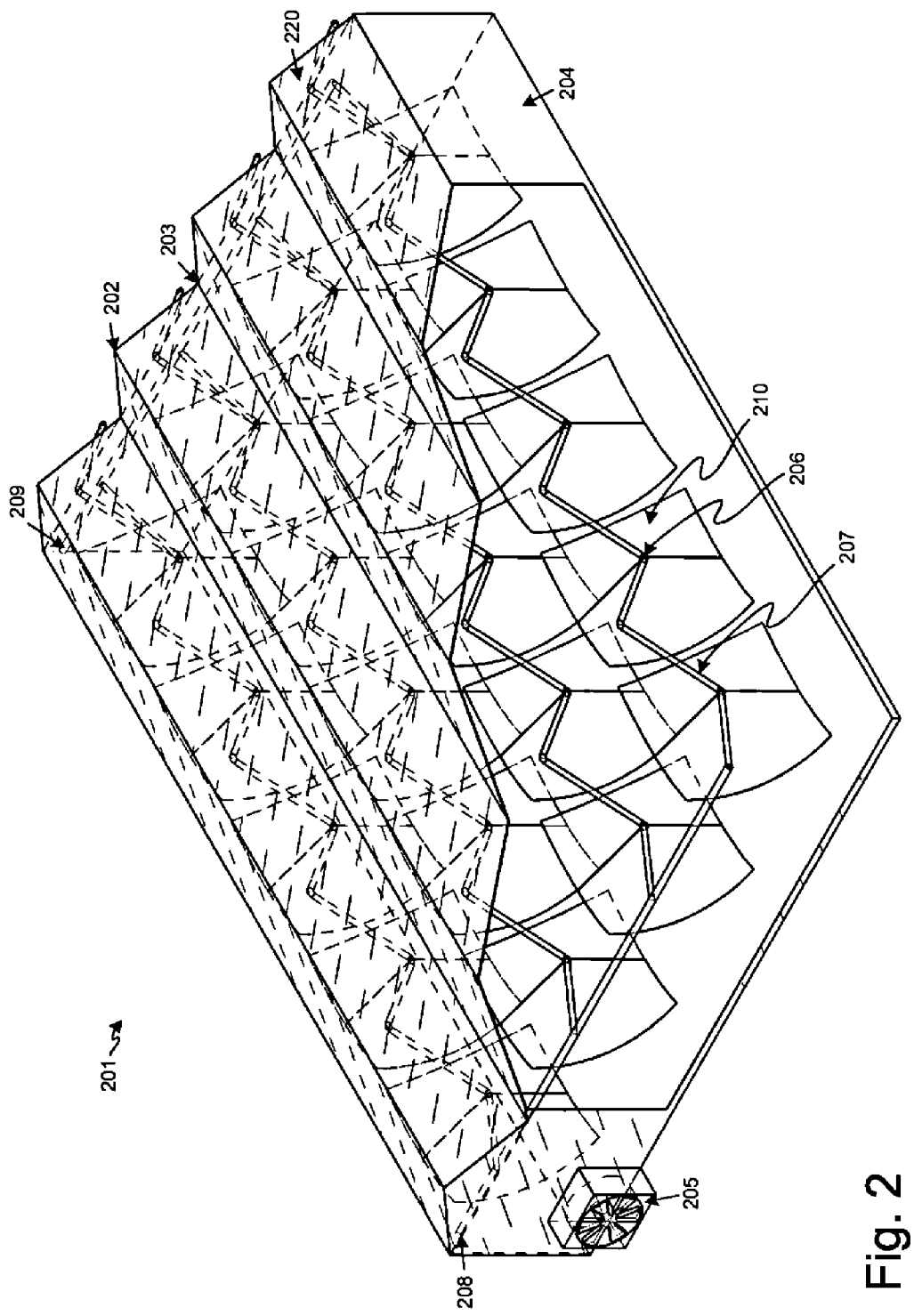
FIG. 2 illustrates a perspective cutaway view of selected details of an embodiment of an enclosing greenhouse and an enclosed concentrated solar energy system.

Industrial scale concentrated solar power systems, in some embodiments, cover multiple acres of land, with large-scale systems practical in the hundreds of acres. FIG. 2 illustrates a perspective cutaway view of selected details of an embodiment of an enclosing greenhouse and an enclosed concentrated solar energy system. Illustrated greenhouse 201 has low internal shading and low cost. According to various embodiments, the greenhouses are less than an acre to hundreds of acres in size. Suitable commercial greenhouses are available with short lead times from various vendors. Additionally, in some usage scenarios, there is a market for used greenhouses, enabling relatively easier financing of large-scale concentrated solar energy projects, such as described herein. Elements of the greenhouse include a roof system with multiple peaks and gutters (such as peak 202 and gutter 203). The roof system is enabled to drain water efficiently from the roof structure, to keep incident angles of sunlight relatively close to directly normal to transparent roof material to reduce reflection, and to keep roof support members in compression. Sidewalls of the greenhouse (such as sidewall 204) further enclose interior space of the greenhouse and have transparent covering where sunlight is incident thereon and are optionally of any appropriate material where little sunlight is incident. The greenhouse structure is enabled to keep most wind, rain, and other environmental elements from the interior, and is optionally not entirely weather tight. Optional fan driven overpressure filtration system 205 optionally provides relatively clean pressurized air to the interior to further inhibit infiltration of dust and other elements to the interior. The lack (or reduction) of dust reduces or eliminates a need to clean concentrators (such as concentrator 210), reducing operating costs and enabling use of less robust and less scratch resistant reflective concentrator materials, in some usage scenarios and/or embodiments.

In some embodiments, all elements of the concentrated solar energy system are located within a protected interior of a greenhouse. Greenhouse transparent cover material 220 is glass or any material generally transparent to sunlight. The transparent cover optionally includes an ultra violet (UV) blocking coating or film to enable use of plastics inside the greenhouse (such as reflective plastic mirror films for the concentrator surfaces) that would otherwise break down relatively rapidly. Solar receivers (such as solar receiver 206) are arranged in a lattice pattern throughout the interior space. In some embodiments, solar receivers are held at somewhat fixed positions during sunlight collecting operation to reduce a need for flexible joints carrying a thermal medium. The solar receivers are interconnected through a series of thermally insulated pipes (such as pipe 207). The pipes carry thermal medium from inlet 208, where colder thermal medium flows into the system, to outlet 209, where heated thermal medium flows out. In a concentrated solar thermal (CST) system, heated thermal medium is a primary output of the system and is fed to an industrial process. In a direct electric system, such as a concentrated photo voltaic (CPV) system, a thermal medium optionally provides cooling to PV cells or other aspects of the receiver. Excess heat in the thermal medium of a CPV system is optionally used in an industrial process. Measurement and control wires, power for motors, and various cabling is routed with the thermal medium pipes, in some CST and CPV embodiments.

Solar receivers are enabled to focus sunlight according to various focusing techniques, such as line focus or point focus. In FIG. 2, point-focus solar receivers are illustrated arranged in an array and are suspended from pipes 207 that are in turn suspended from the roof of the enclosing greenhouse. Point-focus solar concentrators are suspended from associated solar receivers (e.g. solar concentrator 210 is suspended from solar receiver 206) so that the focal point of the concentrator is held relatively fixed on the receiver while the concentrator body remains free to rotate around the receiver in two degrees of freedom to track daily and seasonal motions of the sun. The arrangement of relatively fixed receivers and concentrators that rotate around the receivers to track the sun is enabled, at least in part, by low weight of the concentrators and absence of wind forces on the concentrators.

Rhombic Lattice Pattern

Figure 3:
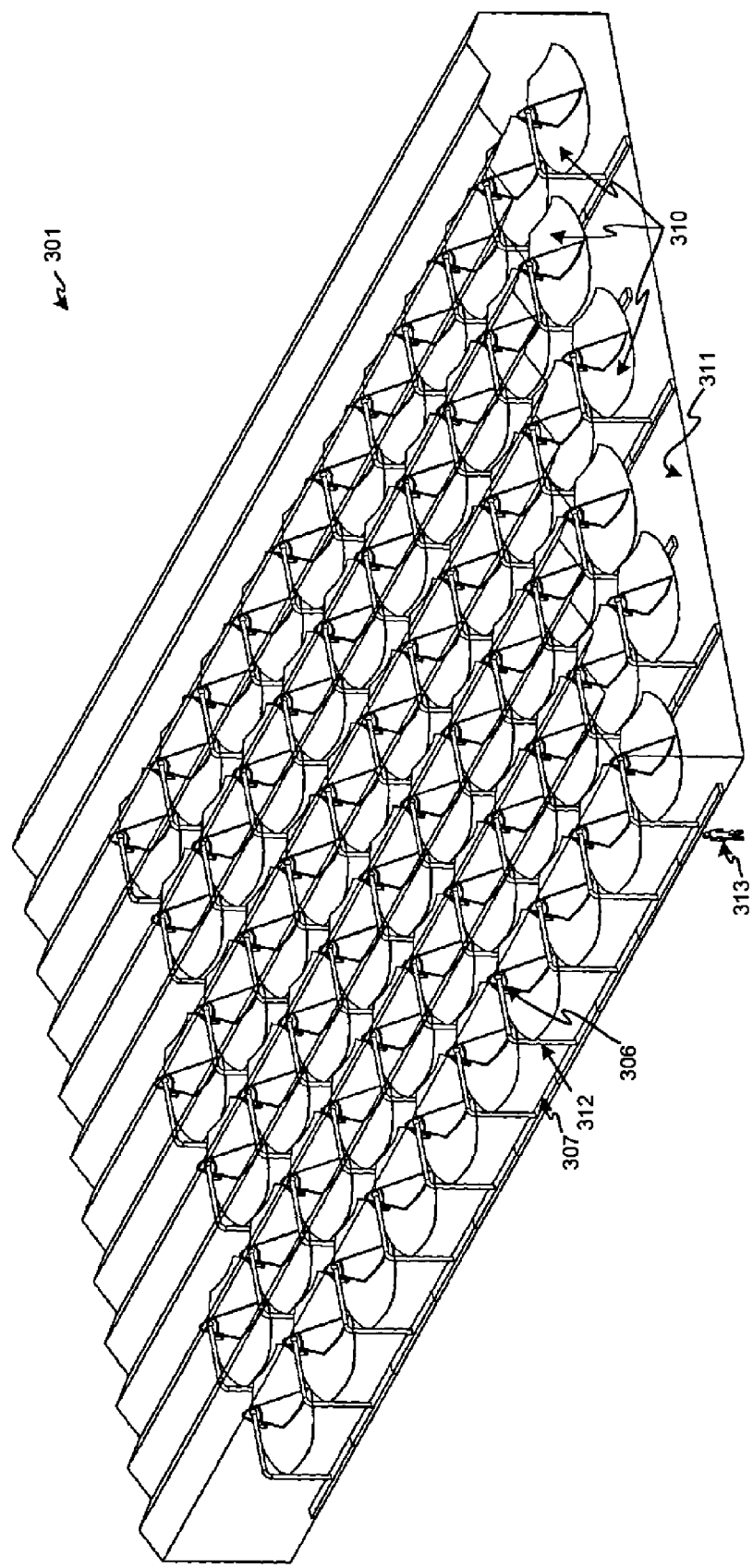
FIG. 3 illustrates a perspective cutaway view of selected details of an embodiment of an enclosing greenhouse with point-focus solar concentrators inside arranged in a rhombic lattice pattern.

FIG. 3 illustrates a perspective cutaway view of selected details of an embodiment of enclosing greenhouse 301 with point-focus solar concentrators inside arranged in a rhombic lattice pattern. Solar receivers (such as solar receiver 306) and point-focus solar concentrators (such as point-focus solar concentrators 310) are arranged in a rhombic lattice pattern to cover relatively efficiently the ground with a tessellated lattice of concentrators. Horizontal pipes (such as horizontal pipe 307) are arranged along greenhouse floor 311 with local feeder pipes connecting to and suspending each receiver (such as local feeder pipe 312 suspending solar receiver 306). Stick figure person 313 illustrates a scale (with respect to greenhouse height as well as concentrator size and spacing) in some embodiments.

Incident Sunlight Transmission

In some embodiments, solar concentrators as large as will fit inside large standard commercial greenhouses, roughly in the six meter aperture range, are used. Each solar concentrator is associated with a drive mechanism and a solar receiver, thus increasing concentrator size (correspondingly reducing how many are used in a particular area) reduces the number of the drive mechanisms and/or the solar receivers, reducing cost overall. In various embodiments, one or more concentrators share a same drive mechanism.

Irradiance characterizes power of incident electromagnetic radiation (such as sunlight) at a surface, per unit area. Some sunlight losses caused by the greenhouse enclosure glass and structural shading are determined by comparing direct normal sunlight received inside the greenhouse enclosure (interior) with unimpeded direct normal sunlight received outside the greenhouse enclosure (exterior). In absolute terms, irradiance loss is highest at midday; considered relatively, the irradiance loss is highest in mornings and evenings. FIGS. 4A and 4B illustrate selected details of an embodiment of a greenhouse enclosure with enclosed solar concentrators and solar receivers in respective incident sunlight contexts, high angle (summer) and low angle (winter). FIG. 4A illustrates a side view of a greenhouse in a context of incident sunlight 414A at a relatively high angle in the sky (e.g. during summer). The greenhouse is situated so that roof peaks (such as roof peak 402) and roof gutters (such as roof gutter 403) run mostly east to west and wall 415 roughly faces the equator.

Thus, incident sunlight mainly strikes both equator facing roof faces (such as equator facing roof face 416) and pole facing roof faces (such as pole facing roof face 417) at an angle relatively close to a respective normal axis of each (equator facing and pole facing) roof face around noon. Light striking glass at an angle greater than approximately 70 degrees off the normal axis of the glass is largely reflected, reducing an amount of solar energy a system is enabled to capture. Solar receivers are suspended from roof peaks (such as solar receiver 406 suspended from roof peak 402) but offset (in some embodiments) slightly toward the equator to more efficiently accommodate seasonal aiming of solar concentrators (such as solar concentrator 410). The solar concentrators are held at a seasonally adjusted height so that at least a portion of incident sunlight 414A is reflected (such as reflected sunlight 418A) and is then concentrated on the solar receivers.

FIG. 4B illustrates the system of FIG. 4A in a context of incident sunlight 414B at a relatively low angle in the sky (e.g. during winter). The solar concentrators are positioned with their upper edges (such as upper edge 419) positioned close to the pole facing roof faces of the greenhouse, so the concentrator are aimed at incident sunlight 414B to reflect at least a portion of the incident sunlight (such as reflected sunlight 418B) onto the solar receivers.

During the winter, almost all of the incident sunlight 414B strikes the equator facing roof faces. The angle of the incident sunlight in relation to the equator facing roof face is less than 70 degrees around noon, enabling relatively high energy transmission. A synchronous tracking movement of the solar concentrators (such as in a tracking mode during daylight hours) enables capturing a relatively high fraction of the incident sunlight. In some embodiments, solar concentrators are enabled to sometimes partly shade one another significantly in the winter months (as illustrated) because the concentrators are relatively inexpensive. The shading enables relatively close concentrator spacing, and provides a relatively high clustering or light exploitation factor, enabling relatively efficient energy recovery throughout the year.

Selected Greenhouse Details

In some embodiments, the greenhouse includes roof peaks (such as roof peak 402) that in combination with included roof gutters (such as roof gutter 403A) are enabled to drain water over a large space and to angle transparent roof material relatively close to direct normal to incident sunlight in summer and in winter. A roof system with peaks and gutters is referred to as a "ridge and furrow" style roof, in some usage scenarios, and in some embodiments is a form of a "gutter-connected" roof system. The greenhouse includes support columns (such as support column 421A). Some of the support columns are arranged around the periphery of the greenhouse and others of the support columns are arranged within the greenhouse. In some embodiments, the greenhouse includes support columns at every roof gutter (such as support columns 421A, 421, and 421B located at roof gutters 403A, 403, and 403B, respectively, of FIG. 4A). In alternate embodiments, every other support column is omitted (such as support columns 421A and 421B being omitted) and trusses (such as truss 422) are horizontal lattice girders. Roof gutters without support columns are floating gutters (e.g. roof gutters 403A and 403B). Some of the embodiments that omit every other support column are implemented with a Venlo style greenhouse. Various embodiments suspend pipes and receivers from trusses or horizontal lattice girders. Various embodiments suspend pipes from trusses or horizontal lattice girders and further suspend receivers from pipes.

Selected Embodiment Details

In various embodiments and/or usage scenarios, the illustrated embodiments are related to each other. For example, in some embodiments, greenhouse 101 of FIG. 1 is an implementation of greenhouse 201 of FIG. 2, with inlet pipe 108 and outlet pipe 109 corresponding respectively to inlet 208 and outlet 209. For another example, in some embodiments, various elements of FIGS. 4A/4B are implementations of elements in other figures, such as roof peak 402, roof gutter 403, solar receiver 406, thermally insulated pipes 407, and solar concentrator 410, corresponding respectively to peak 202, gutter 203, receiver 206, thermally insulated pipe 207, and solar concentrator 210 of FIG. 2.

While the forgoing embodiments are described as having roof systems with peaks and gutters, other embodiments use alternate roof systems, such as peaked, arched, mansard, and Quonset-style roof systems, as well as variations and combinations thereof. In various embodiments, a partially transparent protective enclosure (such as a glasshouse or a greenhouse) uses glass to provide the transparency, and other embodiments use alternative transparent materials such as plastic, polyethylene, fiberglass-reinforced plastic, acrylic, polycarbonate, or any other material having suitable transparency to sunlight and sufficient strength (in combination with a supporting framework) to provide environmental protection.

CONCLUSION

Certain choices have been made in the description merely for convenience in preparing the text and drawings and unless there is an indication to the contrary the choices should not be construed per se as conveying additional information regarding structure or operation of the embodiments described. Examples of the choices include: the particular organization or assignment of the designations used for the figure numbering and the particular organization or assignment of the element identifiers (the callouts or numerical designators, e.g.) used to identify and reference the features and elements of the embodiments.

The words "includes" or "including" are specifically intended to be construed as abstractions describing logical sets of open-ended scope and are not meant to convey physical containment unless explicitly followed by the word "within."

Although the foregoing embodiments have been described in some detail for purposes of clarity of description and understanding, the invention is not limited to the details provided. There are many embodiments of the invention. The disclosed embodiments are exemplary and not restrictive.

It will be understood that many variations in construction, arrangement, and use are possible consistent with the description, and are within the scope of the claims of the issued patent. The names given to elements are merely exemplary, and should not be construed as limiting the concepts described. Also, unless specifically stated to the contrary, value ranges specified, maximum and minimum values used, or other particular specifications, are merely those of the described embodiments, are expected to track improvements and changes in implementation technology, and should not be construed as limitations.

Functionally equivalent techniques known in the art are employable instead of those described to implement various components, sub-systems, operations, functions, or portions thereof.

The embodiments have been described with detail and environmental context well beyond that required for a minimal implementation of many aspects of the embodiments described. Those of ordinary skill in the art will recognize that some embodiments omit disclosed components or features without altering the basic cooperation among the remaining elements. It is thus understood that much of the details disclosed are not required to implement various aspects of the embodiments described. To the extent that the remaining elements are distinguishable from the prior art, components and features that are omitted are not limiting on the concepts described herein.

All such variations in design are insubstantial changes over the teachings conveyed by the described embodiments. It is also understood that the embodiments described herein have broad applicability to other applications, and are not limited to the particular application or industry of the described embodiments. The invention is thus to be construed as including all possible modifications and variations encompassed within the scope of the claims of the issued patent.

What is claimed is:

1. A system comprising:
   means for establishing an at least partially enclosed interior region comprising a selectively protected environment relative to an exterior region;
   means for transmittance of solar radiation from a sun to the interior region;
   within the interior region, means for solar energy receiving at each of a plurality of interior region focal points; and
   within the interior region, means for point-focus concentrating a fraction of the solar radiation transmitted on the interior region focal points while concurrently tracking relative motion of the sun and maintaining the interior region focal points stationary.

2. The system of claim 1, wherein the means for establishing is a greenhouse comprising a roof superstructure comprising the means for transmittance.

3. The system of claim 1, wherein the means for solar energy receiving is enabled to locally convert at least a portion of the solar radiation to electricity.

4. The system of claim 1, wherein the means for solar energy receiving comprises interconnected piping carrying a thermal transport medium heated by the means for solar energy receiving.

5. The system of claim 1, wherein the focal points comprise a rhombic lattice pattern.

6. The system of claim 1, wherein the means for point-focus concentrating comprises a plurality of heliostats.

7. The system of claim 1, wherein the means for point-focus concentrating comprises a plurality of monolithic reflectors.

8. A system comprising:
   an at least partially enclosing structure establishing an interior region comprising a selectively protected environment relative to an exterior region, at least a section of the structure comprising portions enabling transmittance of solar radiation from a sun;
   within the interior region, a plurality of point-focus solar concentrators having a respective plurality of corresponding focal points;
   within the interior region, a respective plurality of solar energy receivers, each of the receivers corresponding to a respective one of the focal points; and
   wherein for each focal point and during a tracking mode of operation, the focal point is stationary with respect to the structure, and the corresponding concentrator is enabled to track relative motion of the sun and maintain focus of a corresponding fraction of the solar radiation transmitted through the portions onto the receiver corresponding to the focal point.

9. The system of claim 8, wherein the structure is a greenhouse comprising a roof superstructure comprising the portions.

10. The system of claim 8, wherein each receiver is enabled to locally convert at least a portion of the solar radiation to electricity.

11. The system of claim 8, wherein the receivers are interconnected with piping carrying a thermal transport medium heated by the receivers.

12. The system of claim 8, wherein the focal points comprise a rhombic lattice pattern.

13. The system of claim 8, wherein each point-focus concentrator comprises a plurality of heliostats.

14. The system of claim 8, wherein each point-focus concentrator is a monolithic reflector.

15. The system of claim 9, wherein the concentrators are suspended from piping suspended from the roof superstructure.

16. The system of claim 8, wherein the interior region is maintained at a positive air pressure relative to the external region.

17. The system of claim 8, wherein each concentrator is enabled to rotate a focal axis of the respective concentrator around its corresponding focal point independently in two axes.

18. The system of claim 8, wherein each concentrator comprises a foam core sandwich backing and a mirror-like non-glass material.

19. The system of claim 11, wherein the receivers are suspended with their weight substantially borne by the piping.

20. A method comprising:
   establishing an at least partially enclosed interior region comprising a selectively protected environment relative to an exterior region;
   admitting solar radiation from a sun to the interior region;
   within the interior region, receiving solar energy at each of a plurality of interior region focal points; and
   within the interior region, point-focus concentrating a fraction of the solar radiation admitted on the interior region focal points while concurrently tracking relative motion of the sun and maintaining the interior region focal points stationary.

21. The method of claim 20, further comprising heating a thermal transport medium with at least a portion of the concentrated solar energy.

22. The method of claim 20, wherein the point-focus concentrating is via a monolithic reflector.

* * * * *